US005504380A

United States Patent [19]

Hellqvist

[11] Patent Number: 5,504,380

[45] Date of Patent: Apr. 2, 1996

[54] METHOD AND APPARATUS FOR CONTROLLING A CURRENT GENERATOR

[75] Inventor: Ole Hellqvist, Haninge, Sweden

[73] Assignee: Landis & Gyr Building Control AB, Huddinge, Sweden

[21] Appl. No.: 244,321

[22] PCT Filed: Oct. 7, 1993

[86] PCT No.: PCT/SE93/00815

§ 371 Date: May 26, 1994

§ 102(e) Date: May 26, 1994

[87] PCT Pub. No.: WO94/09415

PCT Pub. Date: Apr. 28, 1994

[30] Foreign Application Priority Data

Oct. 9, 1992 [SE] Sweden .................................. 9202975

[51] Int. Cl.$^{6}$ ........................................................ H03K 5/22

[52] U.S. Cl. ................................ 307/106; 327/77; 327/18

[58] Field of Search .................................... 327/100–103, 327/561, 563, 437, 484, 334, 263, 269, 270, 560, 77–78; 307/104, 106, 107

[56] References Cited

U.S. PATENT DOCUMENTS 4,417,151 11/1983 Klein et al. .............................. 307/24
4,603,299 7/1986 Monett .................................... 328/151
4,665,327 5/1987 Bacrania et al. ......................... 307/475
4,926,140 5/1990 Schenberg ................................ 331/14

FOREIGN PATENT DOCUMENTS 9100952 10/1992 Sweden .

*Primary Examiner*—Peter S. Wong
*Assistant Examiner*—Aditya Krishnan
*Attorney, Agent, or Firm*—Sughrue, Mion, Zinn, Macpeak & Seas

[57] ABSTRACT

A method and apparatus is provided for varying the characteristics of an output signal of a current generator based on the impedance of a load to which the output signal is applied. The current generator contains first and second voltage inputs and outputs the output signal based on a voltage difference applied across the first and second voltage inputs. The first voltage input receives an externally applied input voltage, and the second voltage input receives the output of a comparator which has a negative input for inputting the external input voltage and a positive input for inputting the output voltage of the current generator. Based on the above configuration, if the load of the impedance is relatively small, the voltage of the output signal is less than the externally applied input voltage, and the comparator outputs zero volts to the second voltage input. Thus, the current value of the signal output by the current generator is dependent upon the external input voltage. On the other hand, if the load impedance is high, the voltage of the output signal is greater than the input voltage, and the comparator outputs a signal proportional to the difference between the input and output voltages. Consequently, the voltage of the output signal depends upon the external input voltage, and the current generator acts like a voltage follower.

9 Claims, 1 Drawing Sheet

FIG. 1
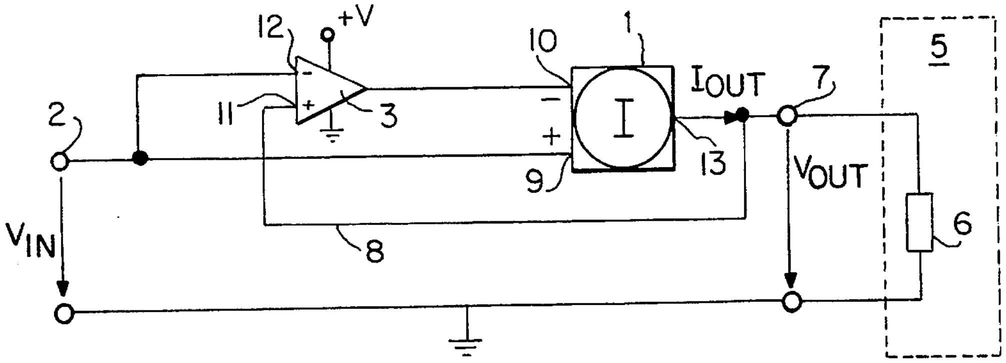
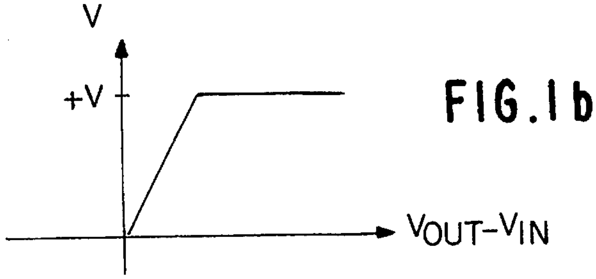
FIG. 1b
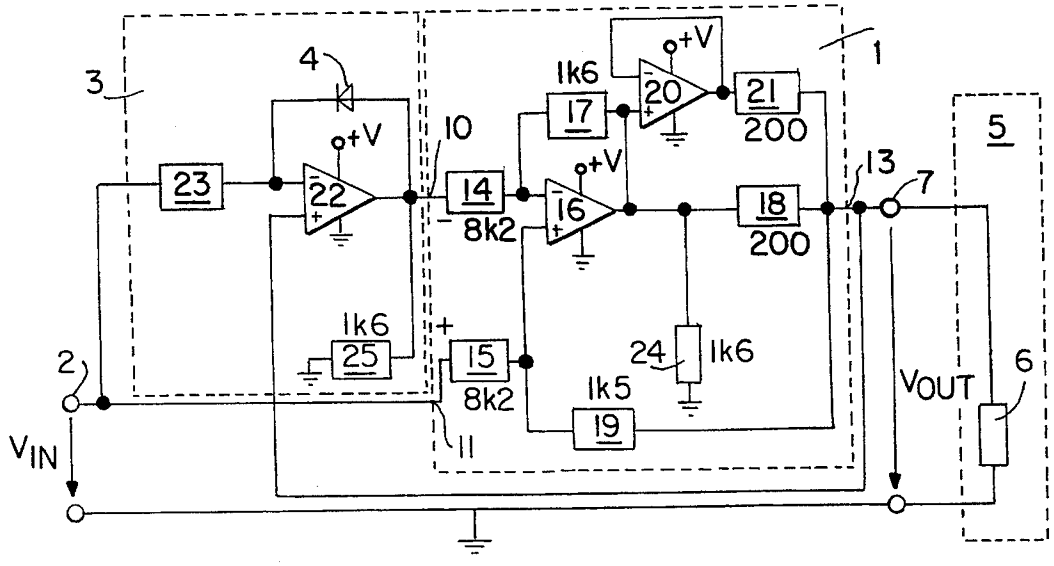
FIG. 2

METHOD AND APPARATUS FOR CONTROLLING A CURRENT GENERATOR

TECHNICAL FIELD

The invention relates to a method of controlling a current generator, which generator has two voltage inputs and a current output connected to a load, and generates a current on the output that is proportional to the difference voltage of the voltages on the inputs. The invention also relates to an apparatus for use with the method.

BACKGROUND OF THE INVENTION

In many devices in the field of control engineering, e.g. regulators, actuators and sensors for proportional control, output values, i.e. desired values and actual values for e.g. valve positions and temperatures, are generally represented by the voltage of an analogue signal that can range between e.g. 0 and 10 volts. In many other devices receiving these analogue signals, these values are expected to be in the form of a current signal, e.g. 0 to 20 mA.

This constitutes a problem, as not all devices will interact, when the output of one device does not correspond to the expected input of another device. In certain devices the mode of operation, i.e. current control or voltage control, can be switched by means of a jumper, e.g., but this switch means one more installation step and it can also lead to an incorrect installation. Also, two separate solutions, one for current control and one for voltage control, lead to a higher cost for electronic circuitry.

OBJECT OF THE INVENTION

Accordingly, the main object of the present invention is to achieve such a method of controlling the output of a current generator that this output is automatically adapted to the preferred mode of operation of a receiving device. The invention also relates to an apparatus for implementation of this method.

SUMMARY

The present invention is based on the realization that the abovementioned object can be achieved using the fact that a current controlled input has a much lower input impedance than a voltage controlled input.

According to the invention, this object is achieved by a method of controlling a current generator having two voltage inputs and an output connected to a load, which generator generates on the output a current proportional to the difference voltage of the voltages on the inputs, so that, if the impedance of the load is lower than a predetermined first lower limiting value, the current generator is controlled in a non-feedback way to generate a signal on the output of the generator, the current value of which signal is determined by said input voltage, and that, if the impedance of the load is higher than a predetermined second limiting value larger than said first limiting value, the output signal of the current generator is negatively fed back to generate an output signal on the output of the generator, the voltage value of which signal is determined by said input voltage.

The invention also relates to an apparatus using the method according to the invention.

The invention provides a technique that eliminates the abovementioned problems connected with adaption of the modes of operation of interconnected devices.

BRIEF DESCRIPTION OF THE DRAWING

The invention will be further described by means of an example with reference to the accompanying drawing, in which:

FIG. 1 is a general diagram of an apparatus according to the present invention, FIG. 1*b* shows the characteristics of an amplifier incorporated in FIG. 1, and FIG. 2 is a circuit diagram of an embodiment of an apparatus according to the present invention.

EXAMPLE OF AN EMBODIMENT

The device according to FIG. 1 comprises, besides a current generator 1, a high gain amplifier 3 with essentially infinite input impedance, which amplifier has ground and a voltage +V as power supplies. The output signal $V_{out}$ of the current generator is supplied to the positive input 11 of the amplifier 3, and an input $V_{in}$ is supplied to the negative input 12 of the amplifier from a voltage input 2, which input signal can represent e.g. a desired or an actual value. The output of the amplifier is connected to the negative input 10 of the current generator. The characteristics of the amplifier 3 are FIG. 1*b*, which shows the output voltage V of the amplifier as a function of the differential voltage across the inputs 11, 12 of the amplifier, in this case $V_{out}-V_{in}$.

The output 13 of the current generator is also connected to a unit 5 to be controlled, via a connection 7. This unit that can be either current or voltage controlled has an input impedance value corresponding to a load resistor 6, the value of which usually is low for current control, for example less than 300 ohms, and high for voltage control, preferably more than 10 kohms.

The method according to the invention will be described in detail below. The input signal $V_{in}$ is supplied to the input 2, which produces a current on the output 13 of the current generator 1, which current in turn generates a voltage $V_{out}$ across the load resistor 6. Since the input impedance of the amplifier 3 is essentially infinite, the output current of the current generator essentially corresponds to the current flowing through the load resistor 6. The device is so adapted that if the load is current controlled, the output voltage $V_{out}$ will not be higher than the input voltage $V_{in}$. Thus, the amplifier 3 receives a negative voltage $V_{out}-V_{in}$ across its inputs 11, 12, which causes it to apply an output voltage essentially equal to ground to the negative input 10 of the current generator, since the amplifier has ground and the supply voltage +V as lower and upper limits (FIG. 1*b*). The entire device then operates as a current generator generating an output current $I_{out}$ determined by the input voltage $V_{in}$.

However, if the load is voltage controlled, i.e. the value of the load resistor 6 is high, the output voltage $V_{out}$ will be higher than the input voltage $V_{in}$, and thus, the amplifier 3 has a positive differential voltage across the inputs 11, 12. This leads to the amplifier supplying a signal to the negative input 10 of the current generator 1, which signal is proportional to the voltage difference between the output voltage $V_{out}$ and the input voltage $V_{in}$. In this case due to the negative feedback of the output voltage $V_{out}$, the gain of the amplifier adjusts the output voltage so that $U_{out} \approx U_{in}$. The entire device then functions as a generator generating on across its output a voltage essentially corresponding to the input voltage, that is, the device operates as a voltage follower.

The embodiment shown in FIG. 2 corresponds in essential parts to the design of the construction described above, so that the same references are used for corresponding parts. Close to each resistor is a resistor value used for this specific embodiment.

The current generator 1, which is of a common type described in e.g. IC Op-Amp Cookbook, Third Edition, Howard W. Sams Co., ISBN-0-672-22453-4 comprises two input resistors 14, 15 connected to the negative and the positive input, respectively, of a first operational amplifier 16. The operational amplifier 16 can be of a conventional type, e.g. LM324. Across the inputs of the operational amplifier 16, there are three resistors 17, 18 and 19 connected in series. Because the two inputs of the operational amplifier 16 are essentially at the same potential, the so called virtual ground, the three resistors 17, 18 and 19 form a closed voltage loop and produce a current on the output 13 of the current generator 1 located between the resistors 18 and 19. This current is proportional to the voltage difference across the two inputs 10, 11 of the current generator, i.e. across the two input resistors 14, 15. In the embodiment shown, a second operational amplifier 20 and a resistor 21 are provided in parallel with the resistor 18 to improve the driving capability of the current generator.

The output of a third operational amplifier 22 is connected to the negative input 10 of the current generator, i.e. to the input resistor 14. The positive input of this amplifier is connected to the output 13 of the current generator, while the negative input is connected to the input 2 of the device via a resistor 23.

Resistors 24 and 25 are respectively connected between the outputs of the first and third operational amplifiers 16, 22, and ground to improve the driving capability of the amplifier to ground. A diode 4 is provided between the output and the negative input of the third amplifier 22 to stabilize the operational amplifier and to improve the capability of the operational amplifier 16 to drive its output to the negative supply.

The load resistor 6 is connected to the output 7 of the device. As previously mentioned, its value depends on whether the load is current or voltage controlled and it can be approximately 200 ohms in the first case and in the latter case approximately 10 kohms.

A preferred embodiment of a device according to the invention has been described above. This can be varied in several aspects within the scope of the claims. For example, the second operational amplifier 20 and the resistor 21 can be omitted if less driving capability of the current generator 1 is required, and the supply voltages of the operational amplifiers could have a positive and a negative voltage, in which case the output signal could be a positive as well as a negative signal.

A method and an apparatus as above can be of use in many applications, as followers in controllers, actual value outputs in actuators or other outputs for physical quantities, where the output signal represents velocity, flow etc.

I claim:

1. A method of controlling a current generator by means of an input voltage, wherein the current generator has first and second voltage inputs and an output connected to a load, wherein said current generator outputs an output signal via the output, wherein a current value of said output signal is proportional to a voltage difference between voltages on the first voltage input and the second voltage input, comprising the steps of:

controlling the current generator in an inactive feedback manner when an impedance of the load is lower than a predetermined first lower limiting value to generate the output signal on the output of the generator, wherein the current value of the output signal is determined by said input voltage, and negatively feeding back the output signal output by the current generator when the impedance of the load is higher than a predetermined second higher limiting value to generate the output signal on the output of the generator, wherein a voltage value of the output signal is determined by said input voltage and wherein said second higher limiting value is larger than said first lower limiting value.

2. A method according to claim 1, wherein the step of negatively feeding back the output signal output by the current generator comprises the steps of:

feeding the input voltage to the first voltage input of the current generator, comparing said input voltage with the voltage value of the output signal of the current generator, supplying the second voltage input of the current generator with a signal essentially equal to ground if the voltage value of the output signal is less than or equal to the input voltage, and supplying the second voltage input of the current generator with a signal proportional to the difference between the voltage value of the output signal and the input voltage if the voltage value of the output signal is greater than the input voltage.

3. A method according to claim 2, wherein an operational amplifier determines if the voltage value of the output signal is less than or equal to the input voltage or if the voltage value of the output signal is greater than the input voltage.

4. A method according to claim 1, wherein the voltage value of the output signal output by the current generator essentially corresponds to the input voltage when the output signal is negatively fed back to the current generator.

5. A method according to claim 1, wherein the first lower limiting value is set to 300 ohms.

6. A method according to claim 1, wherein the second higher limiting value is set to 10 kohms.

7. An apparatus for controlling a current generator by means of an input voltage, wherein the current generator has first and second voltage inputs and an output connected to a load, wherein the current generator outputs an output signal via the output, wherein a current value of the output signal is proportional to a voltage difference between voltages on the first voltage input and on the second voltage input, wherein the apparatus comprises:

an input voltage input connected to the first voltage input of the current generator, and a negative feedback loop provided between the output of the current generator and the second voltage input of the current generator, wherein the negative feedback loop is opened and a signal essentially equal to ground is supplied to the second voltage input of the current generator if an impedance of the load is lower than a predetermined first lower limiting value, and wherein the negative feedback loop is closed if the impedance of the load is higher than a predetermined second higher limiting value so that a signal proportional to the difference between the output signal from the current generator and the input voltage is supplied to the second voltage input of the current generator, wherein said second higher limiting value is larger than said first lower limiting value.

8. An apparatus according to claim 7, wherein the negative feedback loop comprises;

an operational amplifier having a positive input connected to the output of the current generator, a negative input connected to the input voltage input, and an output connected to the second voltage input of the current generator.

9. An apparatus according to claim 8, wherein supply voltages of the operational amplifier comprise ground and a voltage that is higher than a highest possible voltage potential for the input voltage of the input voltage input.

* * * * *